United States Patent [19]
Mang et al.

[11] Patent Number: 6,093,605
[45] Date of Patent: Jul. 25, 2000

[54] METHOD OF MANUFACTURING A NONVOLATILE MEMORY DEVICE HAVING A PROGRAM-ASSIST PLATE

[75] Inventors: Kyong-moo Mang, Seoul; Jung-dal Choi, Kyungki-do, both of Rep. of Korea

[73] Assignee: Samsung Electronics, Co., Ltd., Rep. of Korea

[21] Appl. No.: 09/199,312

[22] Filed: Nov. 25, 1998

Related U.S. Application Data

[62] Division of application No. 08/824,483, Mar. 26, 1997, Pat. No. 5,877,980.

[30] Foreign Application Priority Data

Mar. 26, 1996 [KR] Rep. of Korea ............... 96-8370
Sep. 25, 1996 [KR] Rep. of Korea ............... 96-42687

[51] Int. Cl.[7] ............................................ H01L 21/336
[52] U.S. Cl. ..................................... 438/257; 438/258
[58] Field of Search ............................. 257/316, 314; 438/211, 212, 199, 200, 224, 226, 227, 228, 546, 257, 258

[56] References Cited

U.S. PATENT DOCUMENTS

| | | | |
|---|---|---|---|
| 5,295,096 | 3/1994 | Nakajima | 265/185 |
| 5,338,956 | 8/1994 | Nakamura | 257/316 |
| 5,521,865 | 5/1996 | Ohuchi et al. | 365/185.22 |
| 5,554,867 | 9/1996 | Ajika et al. | 257/314 |
| 5,656,522 | 8/1997 | Komori et al. | 438/258 |
| 5,671,176 | 9/1997 | Jang et al. | 365/185 |
| 5,677,556 | 10/1997 | Endoh | 257/314 |

*Primary Examiner*—Olik Chaudhuri
*Assistant Examiner*—William David Coleman
*Attorney, Agent, or Firm*—Samsung Electronics, Co., Ltd.

[57] ABSTRACT

A nonvolatile memory device in which an electrically conductive "program assist plate" is formed over the nonvolatile memory cells. Appropriate voltages are applied to the program assist plate to greatly increase the cell coupling ratio, thereby reducing the program and erase voltages, and increasing the speed of operation. The manufacturing process is simple, and it results in a more planar structure which facilitates subsequent manufacturing processes.

21 Claims, 12 Drawing Sheets

|  | WITH PA-PLATE | | | W/O PA-PLATE | | |
|---|---|---|---|---|---|---|
|  | Prog | Erase | Read | Prog | Erase | Read |
| B/L("0"CELL) | 0 | F | 1.8 | 0 | F | 1.8 |
| B/L("1"CELL) | Vcc | F | 0.7 | Vcc | F | 0.7 |
| SSL | Vcc | F | Vcc | Vcc | F | 4.5 |
| PA-Plate | 13 | F | Vcc | ○ | ○ | ○ |
| W/L(SELECTED) | 13 | 0 | 0 | 17 | 0 | 0 |
| W/L(UNSELECTED) | Vcc | F | Vcc | 10 | F | 4.5 |
| GAL | 0 | F | Vcc | 0 | F | 4.5 |
| CSL | 0 | F | 0 | 0 | F | 0 |
| BULK | 0 | 16 | 0 | 0 | 19 | 0 |

0 ; Ground
F ; Floating

METHOD OF MANUFACTURING A NONVOLATILE MEMORY DEVICE HAVING A PROGRAM-ASSIST PLATE

This application is a divisional of U.S. application Ser. No. 08/820,483 filed Mar. 26, 1997 and issued Mar. 2, 1999 as U.S. Pat. No. 5,877,980.

BACKGROUND OF THE INVENTION

The present invention relates to a nonvolatile memory device, a method of manufacturing the device, and a method of driving the device, and more particularly, to a nonvolatile memory in which the coupling ratio of the memory cells is increased without increasing cell size, through the structure and operation of a "program assist plate," thereby lowering the operating voltage and increasing the operating speed of the device. The invention may be used in many different types of nonvolatile memory devices, including NAND, NOR, AND, DINOR and other devices.

In a NOR-type electrically erasable programmable read-only memory(EEPROM), two facing memory cells share one bitline contact and one source line, and the memory cells in a row are connected to one bitline. Thus, it is difficult to highly integrate the NOR-type structure, although its high cell current allows it to operate at high speeds.

In a NAND-type structure, two cell strings share one bitline contact and one source line. In one cell string, a plurality of cell transistors are connected in series to the bitline. Accordingly, the NAND-type structure can easily obtain a high level of integration, but it is typically slower than the NOR-type structure due to its low cell current. Because the NAND-type memory cell can be more highly integrated than the NOR-type memory cell, it is generally preferable to employ the NAND-type memory structure for increasing the capacity of a memory device. However, this invention is not limited to application in only NAND type devices The EEPROM NAND string structure and the basic operation of the NAND-type EEPROM are described below, referring to the accompanying drawings.

FIG. 1 is a plan view showing the layout with respect to one string in a typical NAND-type nonvolatile memory device, and FIG. 2 is an equivalent circuit diagram of the structure shown in FIG. 1.

Referring to FIGS. 1 and 2, each string of a NAND-type nonvolatile memory device is formed by sequentially connecting a string selection transistor S1, a plurality of cell transistors C1, ..., Cn and a source selection transistor S2 in series between the bitline B/L and a source line S/L in an area represented by a width x and a length y.

FIG. 3A is a plan view of a transistor cell used in forming each string of the nonvolatile memory device, and FIG. 3B is a sectional view taken along line I—I' of FIG. 3A.

In FIG. 3A, reference numeral 26 indicates a mask pattern for forming an active region, reference numeral 24 indicates a mask pattern for forming a control gate, and reference numeral 22 indicates a mask pattern for forming a floating gate.

Referring to FIG. 3B, each transistor cell C1, ..., Cn of FIG. 1 in the string consists of a floating gate 32, a control gate 34 and a N-type source/drain 36, which are sequentially deposited on a P-type semiconductor substrate 30, with an interdielectric layer inserted therebetween. The programming, erasing and reading of a NAND-type nonvolatile memory device having this structure is described below.

The NAND-type nonvolatile memory is programmed by tunneling an electric charge from a channel region of the cell transistor to the floating gate thereof, to thereby store information. For example, if information is to be programmed or stored in the first transistor cell C1, power supply voltage Vcc is applied to the gate of string select transistor S1, thereby turning on string select transistor S1, and 0V is applied to the gate of source select transistor S2, thereby turning off source select transistor. With reference to FIG. 3B, a programming voltage Vpgm is applied to the control gate 34 of the first transistor cell C1, to thereby generate tunneling. Accordingly, an electric charge in the channel region of the substrate 30 moves to the floating gate 32, to thereby change the threshold voltage Vth of the first transistor cell C1.

After programming, transistor cell C1 will have (approximately) one of two different threshold voltages depending on the charge transferred to the floating gate 32. The first and second threshold voltages may correspond to either a "1" or "0" in a two-state memory device. In a multi-state memory device more than two threshold voltages may be used, thereby storing more than one bit per cell.

A read operation is used to determine the programmed state of the NAND memory cell. For example, referring to FIG. 2, when reading information stored in the first cell transistor C1, the bitline B/L is precharged with a predetermined voltage between approximately 1 V~Vcc. Then, Vcc is applied to each control gate of the string select transistor S1, the source select transistor S2 and unselected cell transistors C2, ..., Cn, (i.e., each cell transistor except for C1) to thereby turn-on the transistors. Approximately 0 V is applied to the control gate of the selected first cell transistor C1, which is between a first threshold voltage of approximately −3 V when a "1" is stored in the cell and a second threshold voltage of approximately 1V when a "0" is stored in cell C1. Thus, if the first cell transistor C1 is turned on, and a current is sensed between the bitline B/L and source line S/L, the state of the first cell transistor C1 is determined as "1". However, if the first cell transistor C1 is turned off, and no (or very little) current is sensed between the bitline B/L and the source line S/L, the state of the first cell transistor C1 is determined as "0". Alternatively, no current could correspond to a "1" and a sensed current could correspond to a "0".

The erasing operation is performed by tunneling an electric charge from the floating gate 32 to the channel region of the substrate 30 (FIG. 3B), thereby erasing information stored in the cell. For example, referring to FIG. 2, when information is to be erased from the first cell transistor C1, the cell string is placed in a floating state by disconnecting it from the bitline B/L and the source line S/L by turning off the string select transistor S1 and source select transistor S2. A voltage of 0V is applied to all wordlines of a selected block of memory cells C1, C2, ... Cn. Further, referring to FIG. 3B, an erase voltage Verase is applied to the substrate 30, thereby generating tunneling from the floating gate 32 to the substrate 30. Thus, the electric charge on the floating gate 32 is moved to the substrate 30, thereby changing the threshold voltage of the selected memory cells.

In the operation of the nonvolatile memory device described above, a high-voltage of approximately 20V is required to program or erase the memory cells by Fowler-Nordheim (referred to as "F-N") tunneling. A charge pumping circuit is required to supply a high voltage for programming and erasing, which results in increased chip size and power consumption. Accordingly, in order to increase the density of a nonvolatile memory device, it is important to increase the efficiency of both erasing and programming, and thereby lower the power requirements for Vpgm and Verase.

In order to enhance the operating characteristics without lowering the reliability of the nonvolatile memory device, the capacitance of the structure corresponding to the interdielectric layer deposited between the control gate 34 and the floating gate 32 must be increased, and the program/erase voltage must be lowered. The capacitance may be increased by reducing the thickness of the interdielectric layer or increasing the contact area of the control gate 34 and the floating gate 32. If the capacitance is increased by reducing the thickness of the interdielectric layer, the data retention capability of the nonvolatile memory device is reduced, and the insulation of the interdielectric layer may be broken during programming and erasing. In addition, the process for producing an interdielectric layer of reduced thickness is difficult. However, a method has recently been developed for increasing the contact area between the control gate 34 and the floating gate 32.

FIG. 4 is a plan view showing a layout of a conventional NAND-type nonvolatile memory device, disclosed in IEDM Tech. Dig. 1994, pp. 61–64, which is incorporated by reference herein. This article discloses a structure and method for obtaining high-integration and increased capacitance with respect to the interdielectric layer by increasing the effective surface area.

In FIG. 4, reference numeral 40 denotes a mask pattern for defining an active region, reference numeral 42 denotes a mask pattern for forming a floating gate, reference numeral 44 denotes a mask pattern for forming a control gate, and reference numeral 46 denotes a mask pattern for forming a bitline contact. The mask pattern 42 for forming the floating gate completely overlaps with the mask pattern 40 for defining an active region. That is, the floating gate is self-aligned on the active region, which leads to high-integration.

FIG. 5 is a sectional view taken along line II–II' of FIG. 4, where reference numeral 50 denotes a semiconductor substrate, reference numeral 52 denotes a floating gate, reference numeral 54 denotes an interdielectric layer, reference numeral 56 denotes a control gate, and reference numeral 58 denotes an isolation film. In this nonvolatile memory device, the area of the interdielectric layer 54 between the floating gate 52 and the control gate 56 is determined only by the width of the active region of the cell transistor. The active regions are the portions of the substrate 50 located between adjacent isolation films 58. Note that the floating gate 52 is not formed on the isolation film 58. Accordingly, the capacitance related to the interdielectric layer 54 is lowered, and the resulting device requires a high voltage for programming and erasing.

To solve the above problems, the thickness of the floating gate 52 of FIG. 5 is increased. However, the thick floating gate 52 structure causes two problems. First, when the control gate 56, the interdielectric layer 54, and the floating gate 52 are patterned in accordance with this process, a vertically high interdielectric layer 54 must be formed on the sidewalls of the thick floating gate 52. In addition, it is difficult to etch the thick floating gate 52 in the source/drain region (not shown) of a cell transistor.

SUMMARY OF THE INVENTION

Accordingly, it is an object of the present invention to provide a nonvolatile memory device having a structure which increases the cell coupling ratio and reduces the program/erase voltage.

It is another object of the present invention to provide a method of manufacturing a nonvolatile memory device with this novel structure.

It is another object of the present invention to provide a method of driving a novel nonvolatile memory device.

To accomplish the objects, there is provided a nonvolatile memory device having an array of nonvolatile memory cells formed on a semiconductor substrate; an insulating layer formed over said array of nonvolatile memory cells; and an electrically conductive program-assist plate formed over said insulating layer.

Also, to accomplish the objects of the present invention, there is provided a nonvolatile memory device having an array of nonvolatile memory cells formed on a semiconductor substrate, said array divided into a plurality of blocks of nonvolatile memory cells; a plurality of insulating layers, each said insulating layer formed over a said block of nonvolatile memory cells; and a plurality of electrically conductive program-assist plates, each said program-assist plate formed over a said insulating layer.

Also, to accomplish the objects of the invention, there is provided a nonvolatile memory device having an array of blocks, each said block comprising a plurality of parallel strings, each said string having a plurality of transistors electrically connected source-to-drain in series with a source select transistor at an end of said string, a string select transistor at another end of said string, and a plurality of cell transistors arranged in said string therebetween, each said string select transistor connected to a bitline and each said source select transistor connected to a source line; each said cell transistor having a floating gate and a control gate with an interdielectric layer therebetween, and sidewalls; a string select line connected to a gate of each string select transistor; a source select line connected to a gate of each source select transistor; a plurality of parallel wordlines arranged perpendicular to said plurality of strings, each said wordline associated with a different one of said cell transistors in a said string, and connected to said control gate of said associated cell transistor in each said string; an insulating film having a predetermined thickness formed over said cell transistors in said block; and an electrically conductive program-assist plate formed on said insulating film.

Also, to accomplish the objects of the invention, there is provided a nonvolatile memory device having an array of blocks, each said block comprising a plurality of parallel strings, each said string having a plurality of transistors electrically connected source-to-drain in series with a source select transistor at an end of said string, a string select transistor at another end of said string, and a plurality of cell transistors arranged in said string therebetween, each said string select transistor connected to a bitline and each said source select transistor connected to a source line; each said cell transistor having a floating gate and a control gate with an interdielectric layer therebetween, and sidewalls; a string select line connected to a gate of each string select transistor; a source select line connected to a gate of each source select transistor; a plurality of parallel wordlines arranged perpendicular to said plurality of strings, each said wordline associated with a different one of said cell transistors in a said string, and connected to said control gate of said associated cell transistor in each said string; an insulating film having a predetermined thickness formed over said plurality of strings in said block; and an electrically conductive program-assist plate formed on said insulating film.

To accomplish the objects, there is provided a method of manufacturing a nonvolatile memory device comprising the steps of:

a) sequentially forming second and first conductivity type wells in a semiconductor substrate of a first conductivity type;

b) forming an isolation film on said semiconductor substrate;

c) forming a gate insulating film on said semiconductor substrate;

d) forming a plurality of gate structures on said gate insulating film, each said gate structure comprising a floating gate on said gate insulating film, an interdielectric layer on said floating gate, a control gate on said interdielectric layer, and sidewalls;

e) forming source/drain regions between said gate structures in said first conductivity type wells in said semiconductor substrate;

f) forming an insulating film over said plurality of gate structures, on said sidewalls, and over said semiconductor substrate; and g) forming a conductive program-assist plate over said insulating film.

Also, to accomplish the objects of the present invention, there is provided a method of manufacturing a nonvolatile memory device comprising the steps of:

a) sequentially forming second and first conductivity type wells in a semiconductor substrate of a first conductivity type;

b) forming an isolation film on said semiconductor substrate;

c) forming a gate insulating film on said semiconductor substrate;

d) forming a plurality of gate structures on said gate insulating film, each said gate structure comprising a floating gate on said gate insulating film, an interdielectric layer on said floating gate, a control gate on said interdielectric layer, and sidewalls;

e) implanting impurity ions of low concentration between said gate structures into said first conductivity type wells in said semiconductor substrate, thereby forming source/drain regions of low concentration;

f) forming a sidewall insulating film having a spacer shape on said sidewalls of said gate structures;

g) implanting impurity ions of high concentration between said sidewall insulator film on said sidewalls into said first conductivity type wells in said semiconductor substrate, thereby forming source/drain regions of high concentration;

h) forming an insulating film over said plurality of gate structures, on said sidewall insulating film, and over said semiconductor substrate; and i) forming a conductive program-assist plate over said insulating film.

To accomplish the objects of the present invention, there is provided a method of operating a nonvolatile memory device having a gate structure formed on a semiconductor substrate, said gate structure comprising a gate insulating layer, a floating gate, an interdielectric layer, and a control gate connected to a wordline; an insulating layer formed above and on sidewalls of said gate structure; and a program-assist plate formed on said insulating layer, the method comprising the steps of: (1) applying a programming voltage to a selected wordline during a programming operation, and simultaneously applying said programming voltage to said program-assist plate during said programming operation; (2) applying a ground voltage to a selected wordline during a read operation, and simultaneously applying either said ground voltage or a voltage of approximately Vcc to said program-assist plate during said read operation; and (3) applying a ground voltage to said program-assist plate during an erase operation.

According to the present invention, the cell coupling ratio is increased, thereby affecting the program/erase operation so as to significantly lower the program/erase voltage. Also, the flatter cell structure leads to a simpler fabrication process, and the program assisting plate has relatively large line/space width which simplifies the photolithography.

Also, with respect to the program assisting plate, the step difference between the select transistor and the wordline can be reduced so that the subsequent processes are facilitated.

BRIEF DESCRIPTION OF THE DRAWINGS

The above objects and advantages of the present invention will become more apparent from the following detailed description of the preferred embodiments, and by reference to the attached drawings in which:

FIGS. 13A through 14B are sectional views, taken along lines III–III' (for FIGS. 13A and 14A) and IV–IV' (for FIGS. 13B and 14B) of FIG. 6, for illustrating a method of manufacturing a nonvolatile memory device according to the second embodiment of the present invention;

DETAILED DESCRIPTION OF THE PREFERRED EMBODIMENTS

The embodiments are described below by reference to NAND type nonvolatile memory devices. However, the structure, manufacturing method, and method of operating a PA-plate in the disclosed embodiments are equally applicable to other nonvolatile memory structures such as AND, OR, and DINOR structures.

Figure 1:
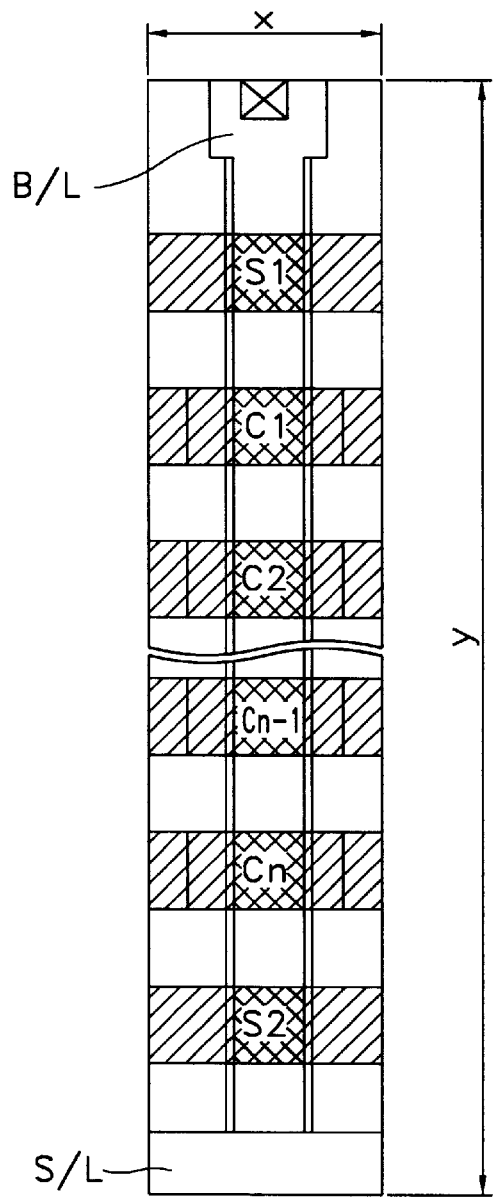
FIG. 1 is a plan view showing the layout of a string of a NAND-type nonvolatile memory device.
Figure 2:
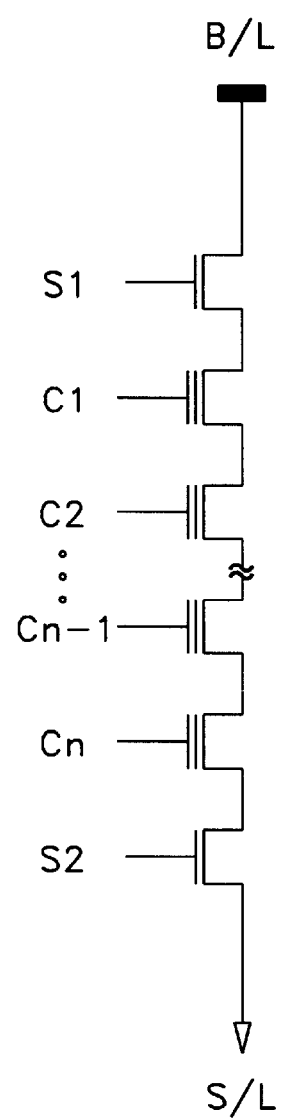
FIG. 2 is an equivalent circuit diagram of FIG. 1.
Figure 3A:
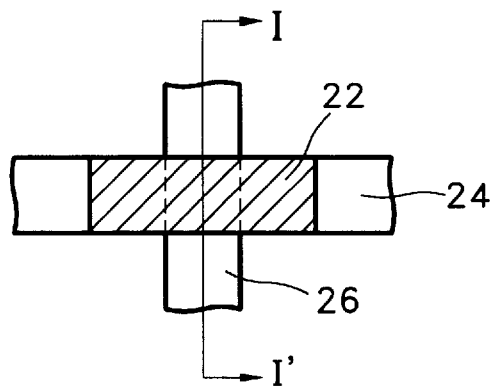
FIG. 3A is a plan view of a cell transistor of the nonvolatile memory device shown in FIG. 1.
Figure 3B:
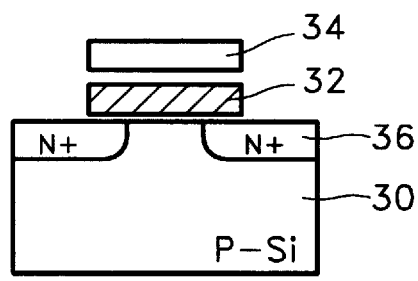
FIG. 3B is a sectional view taken along line I–I' of FIG. 3A.
Figure 4:
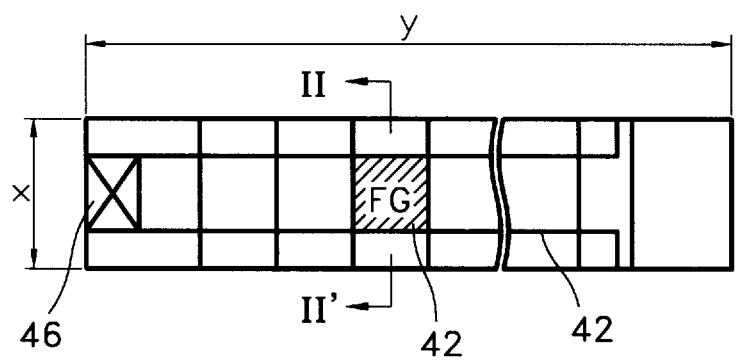
FIG. 4 is a plan view showing the layout of a conventional nonvolatile memory device.
Figure 5:
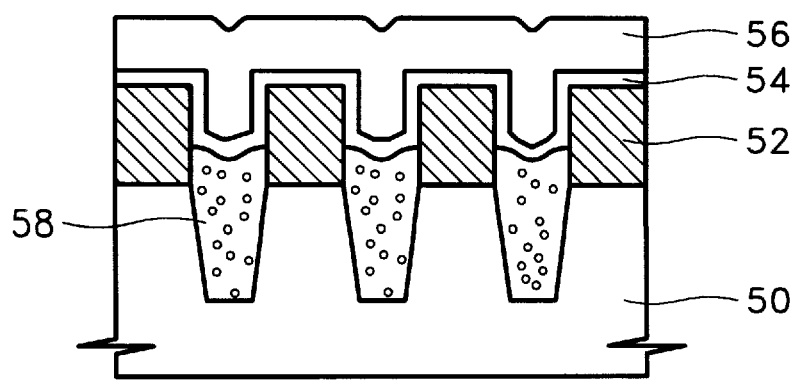
FIG. 5 is a sectional view taken along line II–II' of FIG. 4.
Figure 6:
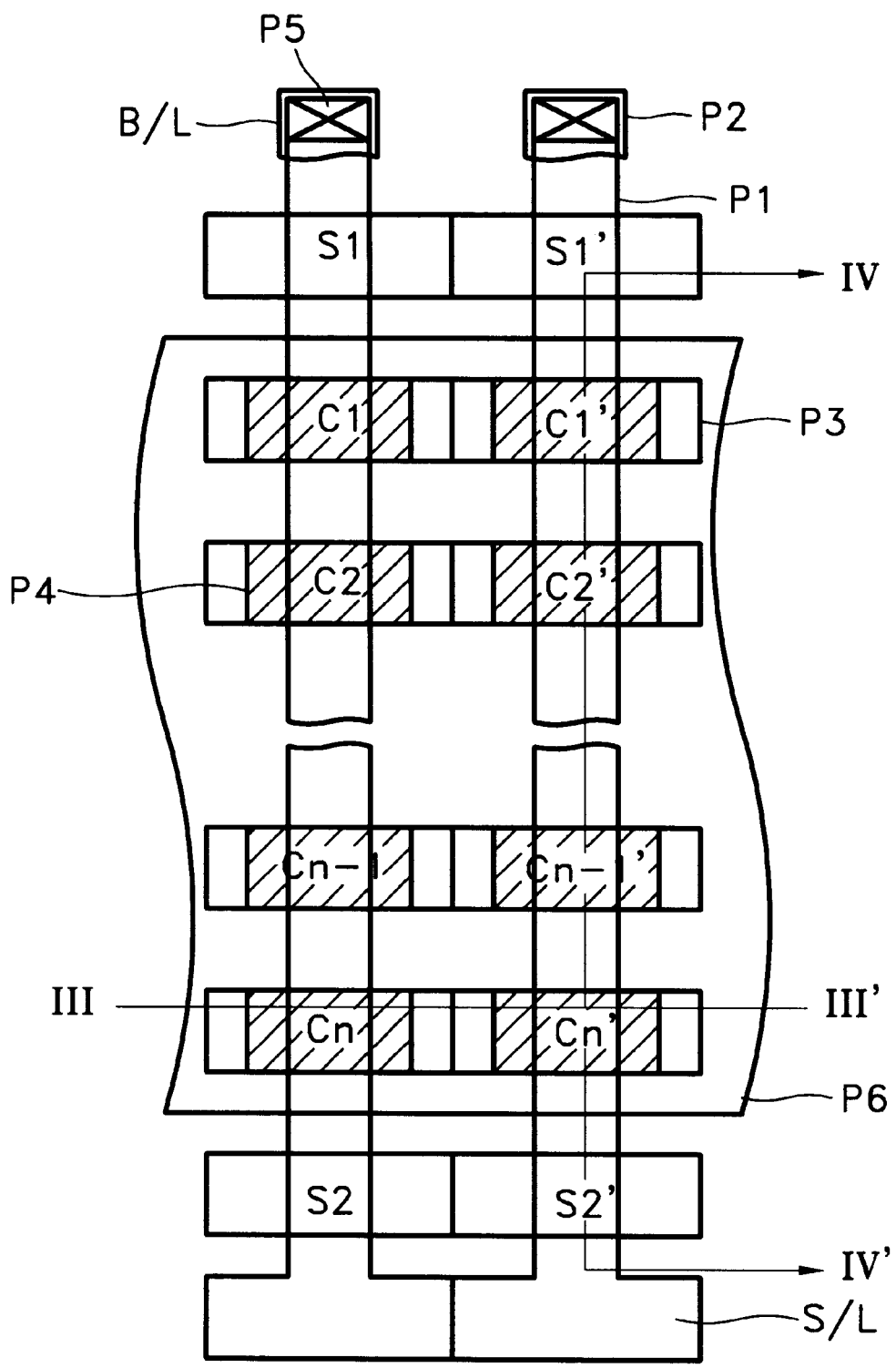
FIG. 6 is a plan view of the layout of a nonvolatile memory device according to first and second embodiments of the present invention.

Referring to FIG. 6, mask pattern P1 defines an active region where a device is to be formed; mask pattern P2, overlapping with mask pattern P1, defines an area for forming a bitline; mask pattern P3 defines a control gate; mask pattern P4, marked by slanted lines in a portion of the mask pattern P3, defines a floating gate; mask pattern P5, marked by an "X" pattern within mask pattern P2, defines a bitline contact; and reference character PG denotes a mask pattern for forming a program assisting plate (PA-plate). In. FIG. 6, the PA-plate mask P6 is shown as covering two NAND nonvolatile memory strings.

In FIG. 6, a generally rectangular program assisting plate (PA-plate) is formed on the cell transistors C1, C2, Cn and C1', C2', . . . , Cn', between the string select transistors S1 and S1' and the source select transistors S2 and S2', . The PA-plate generally defines a block of a plurality of wordline units, although other PA-plate boundaries may be used. The PA-plate may be formed in the wordline direction over a plurality of strings forming each block. A single nonvolatile memory integrated circuit may contain a number of PA-plates, with each PA-plate formed over one or more memory cell strings. Each PA-plate actually may extend over one or more adjacent NAND strings, which is represented in FIG. 6 by the wavy vertical edges of mask P6. A single nonvolatile memory device according to this invention generally will contain a number of PA-plates, each corresponding to a block of memory cells. Alternatively, each PA-plate may cover less than or more than a single block of memory cells.

Figure 7:
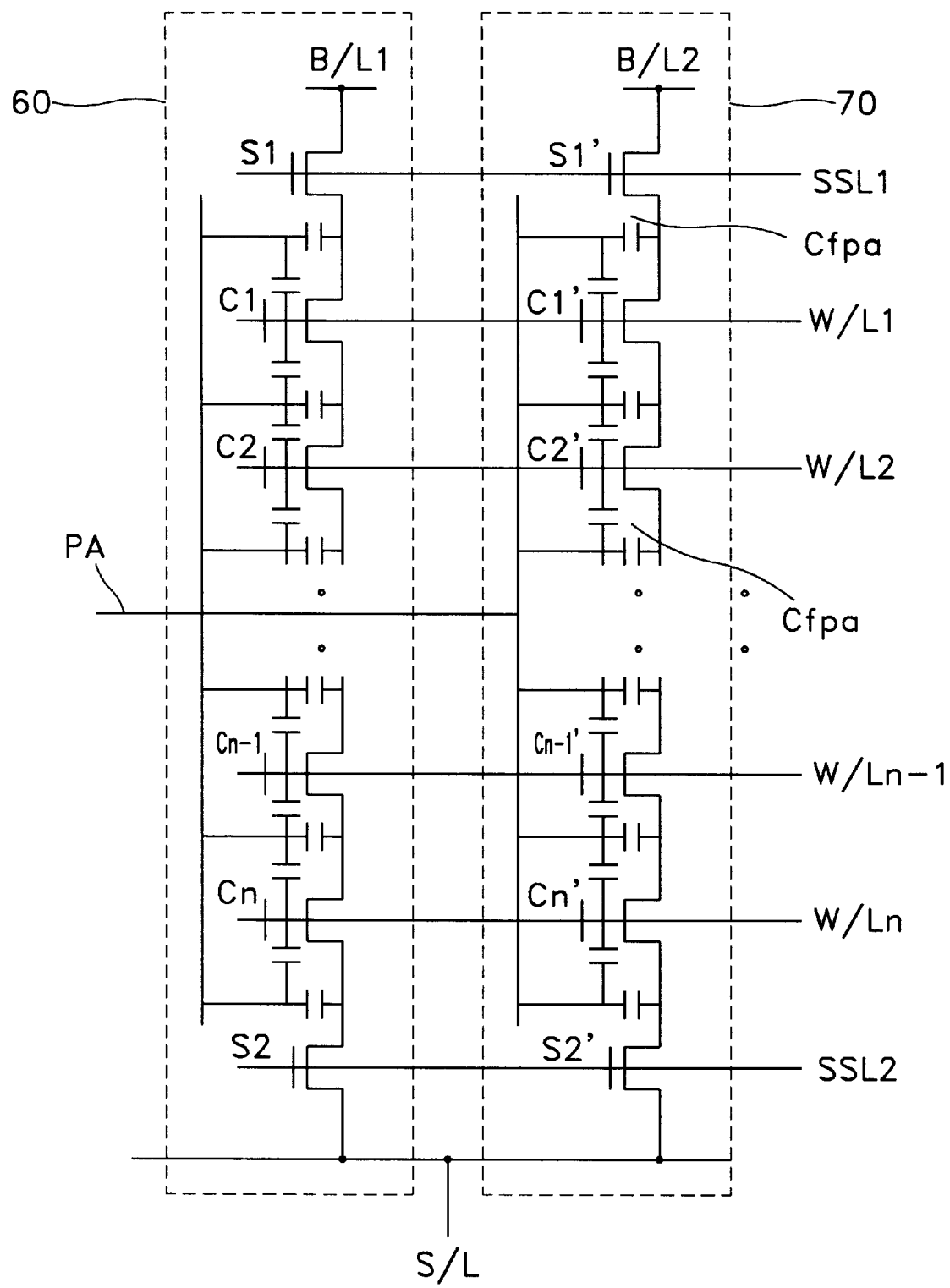
FIG. 7 is an equivalent circuit diagram of FIG. 6.

In FIG. 7, a plurality of linear strings 60 and 70 are arranged substantially parallel in a side-by-side layout. In each string 60 and 70, string select transistors S1 and S1', a plurality of cell transistors C1, . . . , Cn and C1', . . . , Cn', and source select transistors S2 and S2' are connected in series between bitlines B/L1 and B/L2 and a source line S/L. Gates of the string select transistors S1 and S1' are connected by a string select line SSL1. Control gates of the cell transistors C1, . . . , Cn, and C1', . . . , Cn' are connected by a plurality of wordlines W/L1, . . . , W/Ln, respectively. Gates of the source select transistors S2 and S2' are connected by a source select line SSL2.

In FIG. 6, a capacitor Cfpa is formed between the floating gate of the cell transistors C1, . . . , Cn and C1', . . . , Cn and the PA-plate thereof, in which the floating gate and the PA-plate are both electrodes of capacitor Cfpa. A capacitor Cspa is formed between the source/drain of the cell transistors C1, . . . , Cn and C1', . . . , Cn' and the PA-plate thereof, in which the source/drain and the PA-plate are both electrodes of capacitor Cspa. Accordingly, the PA-plate causes a significant increase in the capacitive coupling ratio, as a result of the additional capacitance represented by capacitors Cdpa, Cfpa, and Cspa. The additional capacitance allows a significant reduction in the program/erase voltage of the memory device.

Figure 8A:
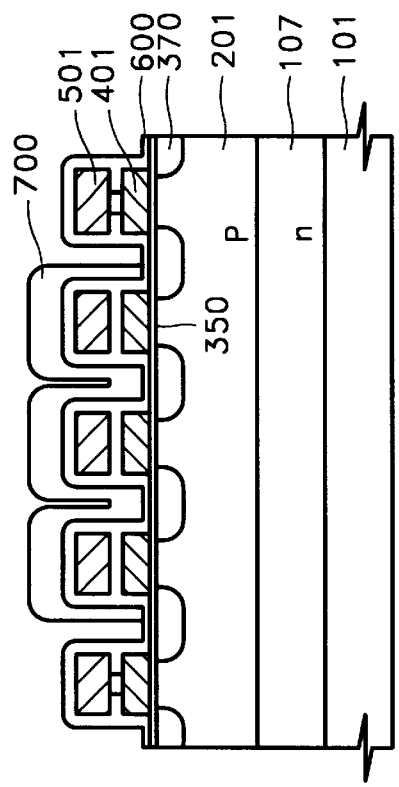
FIGS. 8A and 8B are sectional views, respectively taken along lines III–III' and IV–IV' of FIG. 6, of a nonvolatile memory device according to the first embodiment of the present invention.
Figure 8B:
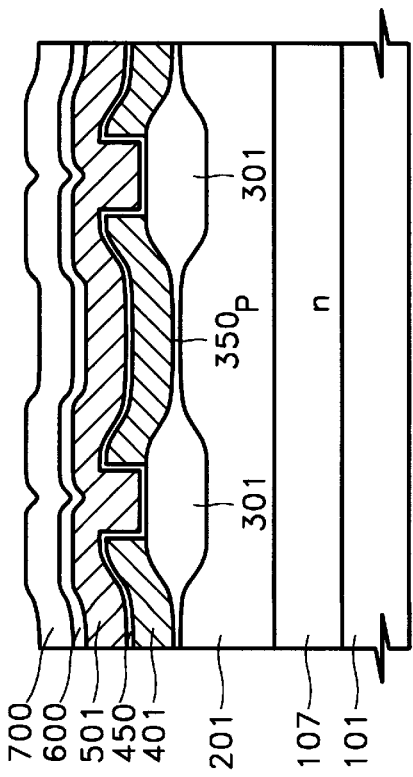

FIGS. 8A and 8B represent a first embodiment of the invention. FIG. 8A is a sectional view taken along line III–III' of FIG. 6, and FIG. 8B is a sectional view taken along line IV–IV'. In FIGS. 8A and 8B, reference numeral 101 denotes a P-type semiconductor substrate, reference numeral 107 denotes an N-well, reference numeral 201 denotes a P-well, reference numeral 301 denotes a field oxide film for dividing the semiconductor substrate into an active region and a non-active region, reference numeral 350 denotes a gate insulating film, reference numeral 370 denotes a source/drain region, reference numeral 401 denotes a floating gate, reference numeral 450 denotes an interdielectric layer, reference numeral 501 denotes a control gate, reference numeral 600 denotes a first insulating film, and reference numeral 700 denotes a program assist plate (PA-plate). Although these figures show a P-type substrate 101, the devices also could be fabricates on an N-type substrate. Note that in the select transistors formed at the ends of the NAND string in FIGS. 8B and 9B, the interdielectric layer 450 is etched-through to form contact hole 800, thereby electrically connecting the floating gate 401 to the control gate 501 when the control gate 501 is formed, so the select transistors operate as normal transistors rather than as floating gate transistors.

Referring to the respective sectional views in FIGS. 8A and 8B, on the P-type (or alternatively, N-type) semiconductor substrate 101, ion implantation is performed at various steps, and the field oxide 301, gate insulation 350, floating gate 401, interdielectric layer 450, and control gate 501 are sequentially deposited. On each side of the gates, N-type (or alternatively, P-type) source/drain regions 370 are formed. The first insulating film 600 and PA-plate 700 are formed on the source/drain regions 370, on the sidewalls of both the floating gate 401 and control gate 501, and on top of the control gate 501.

The PA-plate 700 may formed of polysilicon or polycide where a silicide such as titanium silicide is deposited on the polysilicon. The PA-plate may also be formed of other conductive material such as aluminum, tin, or some other type of metal or metal composition.

The first insulating film 600 acts as a dielectric layer for electrically isolating the source/drain 370, the floating gate 401, and the control gate 501 from the PA-plate 700. The first insulating film 600 has a predetermined permittivity and may consist of, for example, an oxide film, a nitride film, an oxynitride film, an oxide-nitride-oxide laminate (ONO) films or a combination of such films such as a nitride film and an oxide film. Of course, other suitable insulating materials may be used.

Figure 9A:
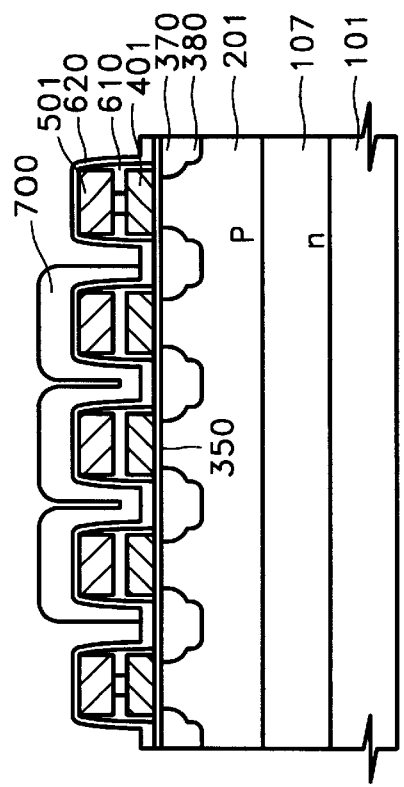
FIGS. 9A and 9B are sectional views, respectively taken along lines III–III' and IV–IV' of FIG. 6, of a nonvolatile memory device according to the second embodiment of the present invention.
Figure 9B:
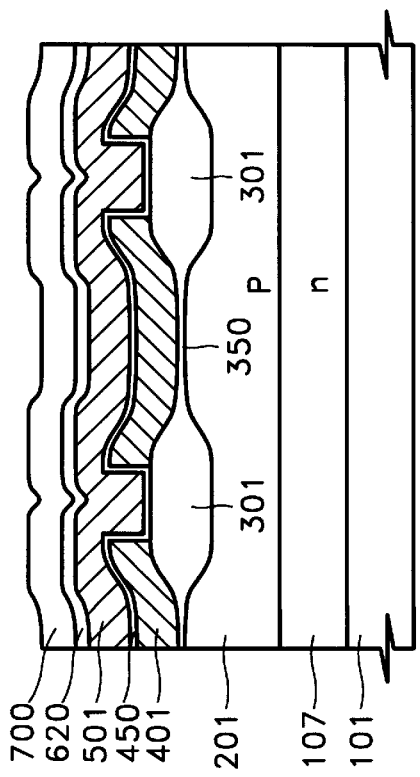

FIGS. 9A and 9B represent a second embodiment of the invention which uses a lightly doped drain (LDD) structure. FIG. 9A is a sectional view taken along line III–III' of FIG. 6, and FIG. 9B is a sectional view taken along line IV–IV'. In FIGS. 9A and 9B, the source/drain 370 has a lightly doped drain (LDD) structure and sidewall spacers 610 are formed on the sidewalls of the floating gates 401 and control gates 501.

In FIGS. 9A and 9B, reference numeral 380 denotes a LDD type source/drain region having low concentration, reference numeral 390 denotes a source/drain region having a high concentration, reference numeral 610 denotes a spacer-shaped sidewall insulating film formed on the sidewalls of both the floating gate 401 and the control gate 501, and reference numeral 620 denotes a first insulating film. The sidewall and first insulating films 610 and 620 may consist of oxide films, nitride films, oxynitride films, an ONO film, or a combination of such films such as a nitride film and an oxide film. Of course, other suitable insulating materials may be used.

Figure 10A:
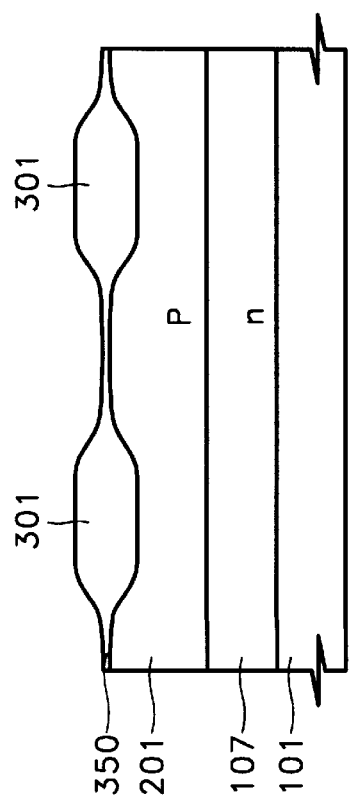
FIGS. 10A through 12B are sectional views, taken along lines III–III' (for FIGS. 10A, 11A, and 12A) and IV–IV' (for FIGS. 10B, 11B, and 12B) of FIG. 5, for illustrating a method of manufacturing a nonvolatile memory device according to the first embodiment of the present invention.

FIGS. 10A through 12B are sectional views for illustrating the manufacturing method of a nonvolatile memory device according to a first embodiment of the present invention. Here, FIGS. 10A, 11A and 12A are sectional views taken along line III–III' of FIG. 6, and FIGS. 10B, 11B and 12B are sectional views taken along line IV–IV' of FIG. 6.

Figure 10B:
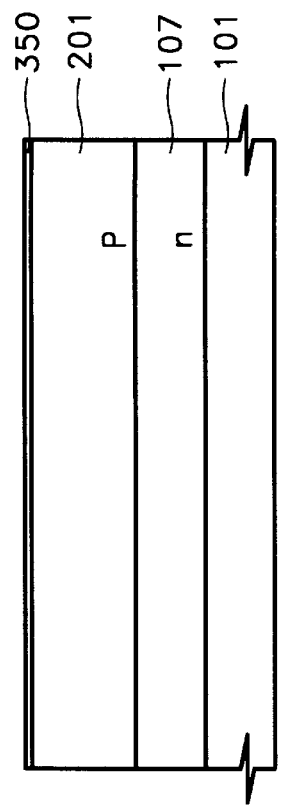

FIGS. 10A and 10B show the step of forming a field oxide film 301 and a gate oxide film 350 on a P-type portion 201 of a semiconductor substrate 101. Alternatively, the structures may be formed on an N-type portion of a semiconductor substrate without departing from the scope of this invention.

Referring to FIGS. 10A and 10B, a second conductivity type well 107 is formed in a first conductivity type semiconductor substrate 101, and a first conductivity type well 201 is formed in the second conductivity type well 107. A field oxide film 301 is formed on a surface of the substrate where the first and second conductivity type wells are formed, for electrically isolating the active devices, and a gate oxide film 350 is formed on the resultant structure. Of course, it may be possible to form the gate oxide film 350 before forming the field oxide film 301, but this is generally not as practical.

For example, in FIGS. 10A and 10B, N-type impurities are implanted into a predetermined region of a P-type semiconductor substrate 101 using photolithography and ion-implantation. Then, the ion-implanted region is diffused to a desired depth by heat treating at a high temperature, to thereby form the N-well 107. Then, the P-well 201 is formed using the same method on a predetermined region of the N-well 107. Next, the isolation film 301 is formed by a typical isolation method, for example, local oxidation of silicon (LOCOS), and a thin thermal oxide film is grown on the entire surface of the formed isolation film, to thereby form a gate oxide film 350.

Figure 11A:
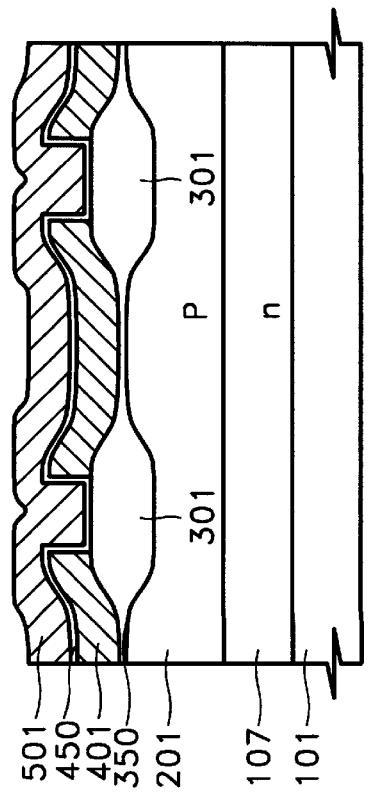
Figure 11B:
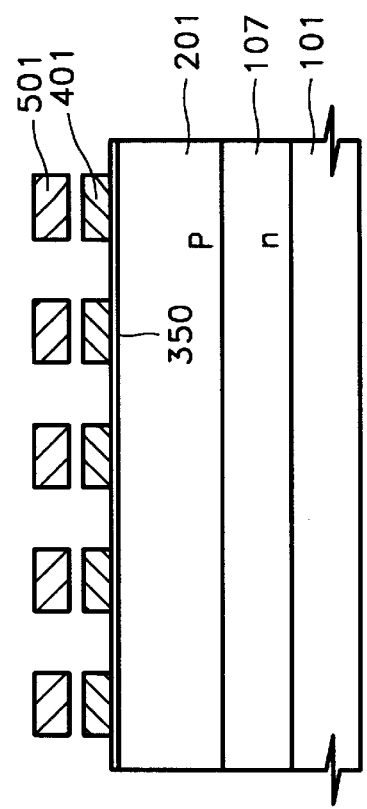

FIGS. 11A and 11B show the steps of forming a floating gate 401, an interdielectric layer 450, and a control gate 501 according to the first embodiment. A floating gate 401 is formed on the gate oxide film 350; an interdielectric layer 450 having a predetermined thickness is formed on isolation film 301, gate oxide film 350, and floating gate 401; and control gate 501 is formed on the interdielectric layer 450.

For example, in FIGS. 11A and 11B, conductive material for forming a gate electrode, such as polysilicon doped with impurities, is deposited on the gate oxide film 350, and the polysilicon is patterned by photolithography using the mask pattern P4 of FIG. 6 for forming a floating gate, to thereby form the floating gate 401. An insulation film is deposited on the floating gate 401, such as a sequentially deposited oxide film, nitride film and oxide film (ONO film), to thereby form an interdielectric layer 450. The interdielectric layer 450 insulates the floating gate 401 from the control gate 501, and acts as a dielectric layer over the floating gate 401.

The select transistors operate as typical transistors rather than as floating gate storage devices. Therefore, in the areas where select transistors are to be formed, the interdielectric layer 450 is patterned to create contact holes 800 through the interdielectric layer 450 so that the subsequently formed control gate 501 will be electrically connected to the floating gate 401 in the select transistors. Then, a conductive layer, such as polysilicon doped with impurities or a polycide, is deposited on the inzerdielectric layer 450 and through the contact holes 800. The polycide may have a stacked structure of a doped polysilicon and a silicide such as titanium silicide. The conductive layer is then patterned using the mask pattern P3 of FIG. 6, to thereby form a wordline, which becomes the control gate 501 of the cell transistors. Alternatively, the control gate 501, interdielectric layer 450, and floating gate 401 could be simultaneously patterned in the wordline direction using mask P3 of FIG. 6, after performing the steps of: depositing and patterning the layer for the floating gate 401; depositing the interdielectric layer 450; forming contact holes 800 through the interdielectric layer 450; and depositing the conductive layer for the control gate 501.

After a conductive layer for forming the control gate 501 is deposited, an oxide film is deposited on the entire surface of the resultant structure. Then, the oxide film is patterned by a typical photolithography process using the mask pattern P3 of FIG. 6. Using the patterned oxide film as a mask, etching may be used to pattern the control gate 501, the interdielectric layer 450, and the floating gate 401. The remaining oxide film mask can be used as part of the insulating film for isolating the control gate 501 from the PA-plate 700 which is formed in a subsequent process.

Figure 12A:
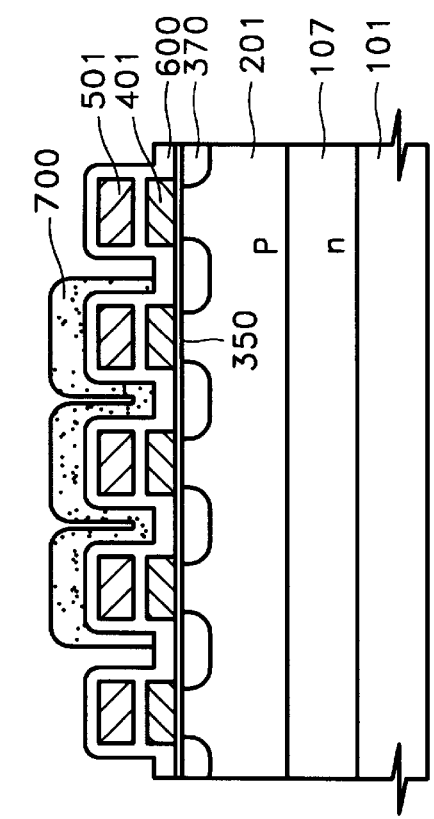
Figure 12B:
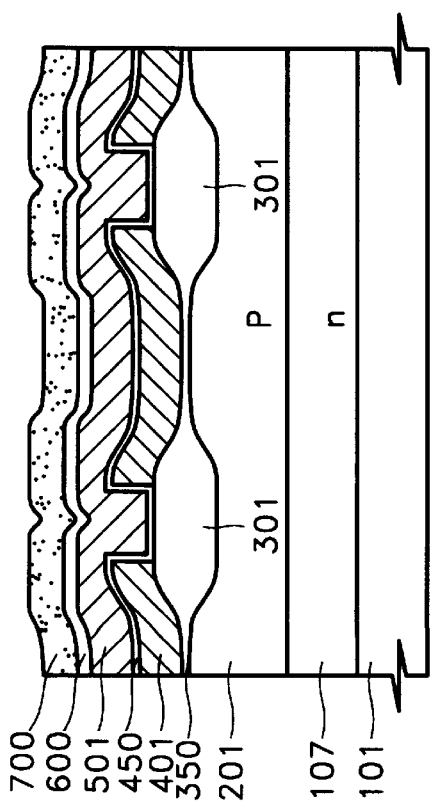

FIGS. 12A and 12B show the steps of forming source/drain regions 370, a first insulating film 600, and a PA-plate 700. The process is performed by implanting impurities on the sides of the wordlines into a portion of a semiconductor substrate 201, thereby forming source/drain regions 370, forming a first insulating film 600, and depositing conductive material on the resultant structure and patterning the conductive film to form PA-plate 700.

In greater detail with reference to FIGS. 12A and 12B, if semiconductor substrate region 201 is a P-type, then N-type impurities such as arsenic (As) or phosphorus (P) are implanted adjacent to the wordlines into semiconductor region 201 at a dose of approximately $2\times10^{13}$~$1\times10^{15}$ ion/cm$^2$ and at an energy of approximately 40 KeV~60 KeV, thereby forming source/drain regions 370 for the cell transistors. Implants for the other transistors also may be performed at this time. First insulating film 600 is then formed over the cell region. It may consist of a single film such as an oxide film, a nitride film, or an oxynitride film, or it may be composed of a composite film in which the films are deposited in a multilayered structure such as an oxide/nitride/oxide (ONO) film. Next, a conductive film is formed over the first insulating layer 600. The conductive film may be composed of polysilicon doped with impurities, a polycide in which silicide is deposited on doped polysilicon, a metal or metal compound, or of some other conductive material. The conductive film is patterned using the mask pattern P3 of FIG. 6, to thereby form PA-plate 700.

After the above process, an insulating layer (not shown) is formed over the resulting structure. The insulating layer may be formed by sequentially depositing a high temperature oxide (HTO) film and a silica film which may include boron and phosphorus, such as a boro-phosphorus silicate glass (BPSG) film, and then planarizing the deposited films. A bitline contact (not shown) may then be formed by photolithography using the mask pattern 25 of FIG. 6, for connecting an active region of the semiconductor substrate and a bitline. A bitline (not shown) is then formed by depositing a conductive material on the bitline contact (not shown) and patterning it using mask pattern P2 of FIG. 6. Then, the interconnects and a protective film are formed.

Figure 13A:
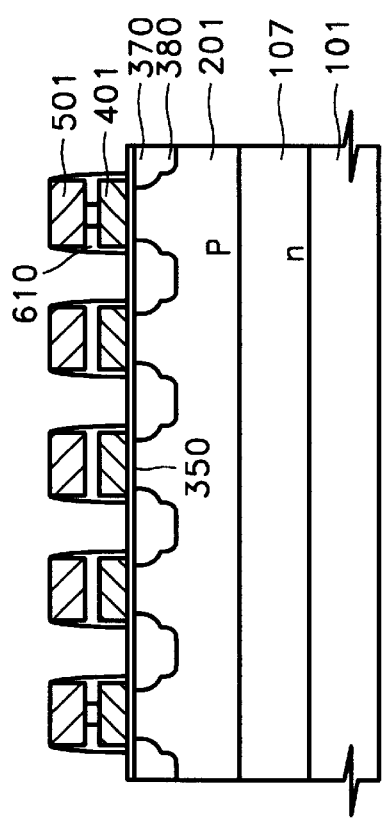
Figure 13B:
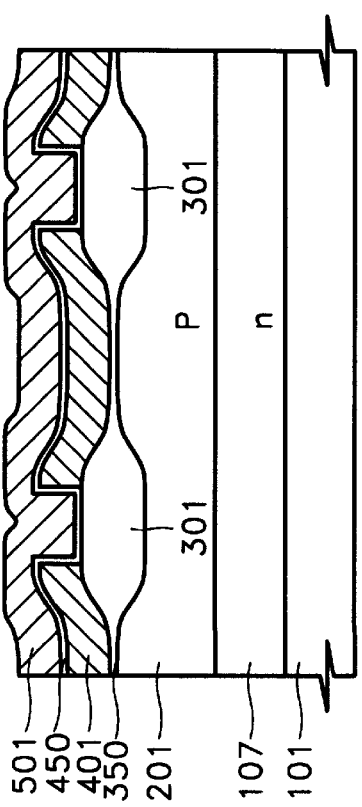
Figures 14A, 14B:
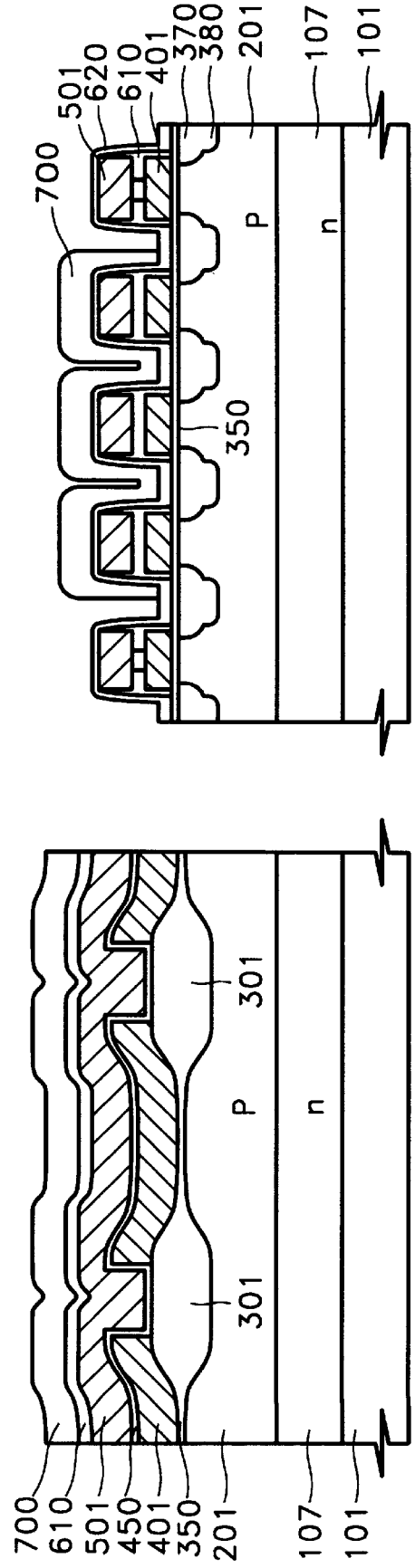

FIGS. 13A through 14B are sectional views for illustrating a method of manufacturing a nonvolatile memory device according to the second embodiment shown in FIGS. 9A and 9B. FIGS. 13A and 14A represent sectional views taken along section III–III' of FIG. 6, and FIGS. 13B and 14B represent sectional views taken along section IV–IV' of FIG. 6. In the second embodiment, the process of forming a wordline-is very similar or the same as that in the first embodiment, and the reference numerals which are the same as the ones used in FIGS. 11A through 11B represent the same types of structures. Although FIGS. 8B, 9B, 12B and 14B show a NAND string having three cells with a select transistor at each end, this invention is applicable to NAND strings of any length, and to nonvolatile memory devices having other structures such as NOR, AND, DINOR, and other structures.

FIGS. 13A and 13B show a process of forming source/drain regions having both low and high concentrations of impurities, in a well-known lightly doped drain (LDD) structure. The process is performed by implanting impurities of low concentration into a semiconductor substrate on the sides of the wordlines, thereby forming source/drain regions 380 of low concentration, forming a sidewall insulating film G6O on the sidewalls of the wordline structure including floating gate 401 and control gate 501 and implanting impurities of high concentration into the semiconductor substrate, thereby forming source/drain regions 390 of high concentration.

In detail, the control gate 501 may be formed by the same method as that in the first embodiment, and then impurities- of a second conductivity type opposite from the substrate type, i.e., N-type impurities such as arsenic (As) or phosphorus (p) in the case of a P-type semiconductor substrate, are ion-implanted into the semiconductor substrate, in a dose of approximately $2 \times 10^{13} \sim 1 \times 10^{14}$ ion/cm$^2$ and at an energy of approximately 40 KeV~60 KeV, to thereby form the source/drain regions 380 of low concentration.

Next, an insulating film, for example, an oxide film, nitride film, and oxynitride film, singly or in combination, or a composite film of an oxide film and a nitride film, is deposited on the resultant structure and then the deposited film is etched-back, to thereby form the sidewall insulating film 610 as a spacer on the sidewalls of the wordline structure including the floating gate 401 and the control gate 501. Subsequently, impurities of a second conductivity type, i.e., N-type impurities such as arsenic (As) or phosphorus (P), are implanted into the semiconductor substrate, in a dose of approximately $1 \times 10^{14} \sim 5 \times 10^{15}$ ion/cm$^2$ and at an energy of approximately 40 KeV~60 KeV, to thereby form source/drain regions 390 of high density. Other well-known methods may be used to form lightly-doped drain (LDD) memory cells within the scope of this invention.

FIGS. 14A and 14B show the steps of forming a first insulating film 620 and a PA-plate 700. In detail, an oxide film, a nitride film, or an oxynitride film, or a composite film of a nitride-oxide (NO) or an oxide-nitride-oxide. (ONO) structure is deposited on the resultant structure, or thermally grown, to thereby form the first insulating film 620. A conductive layer is formed on the first insulating film 620. For example, the conductive layer may be a polysilicon layer doped with impurities or a polysilicon-silicide layer. The conductive layer is then patterned to form PA-plate 700. Thus, the PA-plate 700 is formed on the sidewall and first insulating films 610 and 620, which are formed on the cell transistors and source/drain regions 380 and 390. Of course, the PA-plate 700 may be formed of metal or some other suitable conductive material.

After the above process, the typical process of forming an interdielectric layer and interconnection lines is performed by the same method as disclosed in the first embodiment.

Other types of known processes and structures may be used to form floating gate transistors which operate as nonvolatile memory cells. This invention discloses the structure, use, and method of forming a PA-plate which may be used in conjunction with any floating gate transistor or similar device. The invention may be used with NAND, NOR, AND, DINOR, and other types of nonvolatile memory structures which operate using Fowler-Nordheim tunneling, hot electron injection, or other methods of transferring a charge to and from a floating gate or of otherwise storing information.

In a non-volatile memory device according to first and second embodiments of the present invention and a manufacturing method thereof, an increase in the capacitive coupling ratio of a cell can greatly lower the program/erase voltage. Also, since the PA-plate has a relatively large line spacing, the photolithography process can be easily performed.

Because of the demand for highly integrated and dense circuitry, the cell transistors including gate structures (401, 450, and 501) shown in FIGS. 11B and 13B are located very close to each other, and the width of the trench between adjacent cell transistors is very narrow. Accordingly, there is a significant height difference or "step difference" between the top of a multilayer gate structure (401, 450, 501, and 600) shown in FIGS. 12B and 14B and the bottom of the insulating layer 600 formed in an adjacent trench. This step difference makes it very difficult to achieve fine patterning, particularly when the edge of a pattern must be formed in the trench. In the first and second embodiments shown in FIGS. 123 and 142, the PA-plate 700 is formed to cover the cell transistors C1, C2, . . . , Cn (FIG. 6), while not covering the select transistors S1 and S2 on the ends of the string. Therefore, the mask pattern P6 in FIG. 6 must be formed so that it has edges which are located in the bottom of the trench area between cell transistors and select transistors, as can be seen from the location of the edges of the resultant PA-plate 700 shown in FIGS. 12B and 14B, which is formed from the mask pattern P6 in FIG. 6. Certain problems may be caused by fine patterning in areas of significant step differences, such as the accumulation of residue in the trench area. The third and fourth embodiments of this invention avoid this problem by utilizing a mask pattern P7 in FIG. 15 which encompasses the select transistors S1, S2, S1', and S2', thereby resulting in a PA-plate structure 710 shown in FIGS. 16B and 17B which does not have edges in the narrow trench regions between adjacent memory string transistors. Of course, alternative embodiments may encompass a PA-plate which is formed in a different position which does not cover all of the select transistor structures.

According to the above first and second embodiments of the present invention, polysilicon is deposited on a substrate for forming a PA-plate on a cell transistor, and then the deposited polysilicon layer is patterned, where the patterning process is performed by typical dry etching. Here, due to a high step difference between the cell transistor and the select transistor, the polysilicon between the string select line and a first wordline and between a source select line and a last wordline is not completely removed. When etching time is increased to completely eliminate the remnants of the polysilicon layer, damage to the substrate occurs in the etched portion.

In the third and fourth embodiments, a method and structure is disclosed which overcomes these difficulties.

Figure 15:
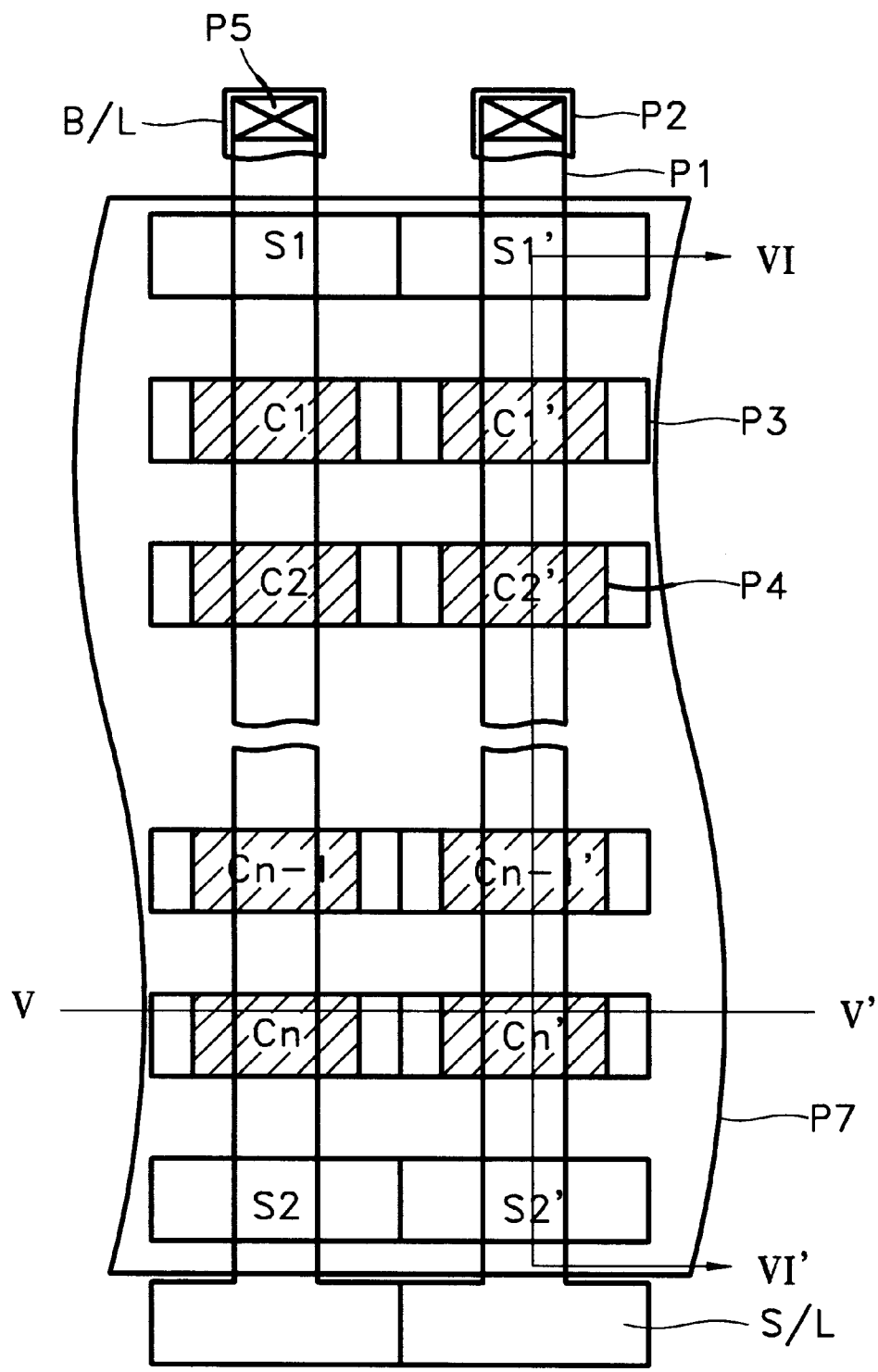
FIG. 15 is a plan view for illustrating a method of manufacturing a nonvolatile memory device according to third and fourth embodiments of the present invention.

Referring to FIG. 15, reference numerals that are the same as those in FIG. 6 represent the same portions as those in FIG. 6. In FIG. 15, reference character P1 denotes a mask pattern for defining an active region where a device is to be formed, reference character P2 denotes a mask pattern for forming a bitline, reference character P3 denotes a mask pattern for forming a control gate, reference character P4 denotes a mask pattern for forming a floating gate, reference character P5 denotes a mask pattern for forming a bitline contact, and reference character P7 denotes a mask pattern for forming a program assisting plate (PA-plate). Also, the PA-plates are formed on the cell transistors C1, ..., Cn and C1'...., Cn', on string select transistors S1 and S1', and on source select transistors S2 and S2'. Alternatively, the PA-plates may be formed over only the cell transistors and string select transistors, only the cell transistors and source select transistors, or over the cell transistors and partially covering either or both of the string select and source select transistors. The equivalent circuit for the cell transistors in FIG. 15 is basically the same as disclosed in FIG. 7.

Figure 16A:
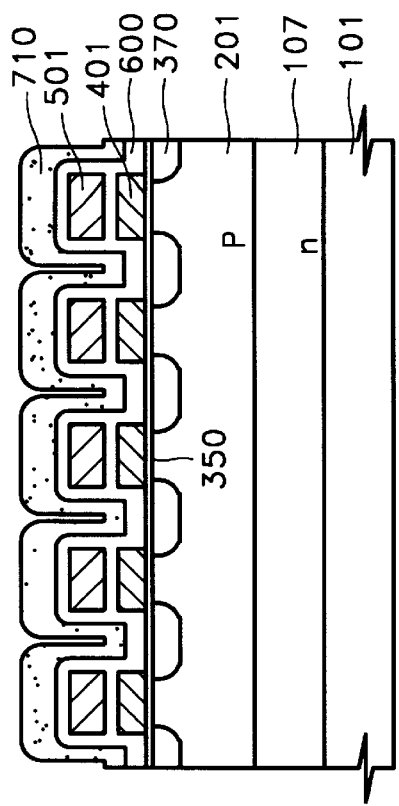
FIGS. 16A and 16B are sectional views, respectively taken along lines V–V' and VI–VI' of FIG. 15, showing a nonvolatile memory device according to the third embodiment of the present invention.
Figure 16B:
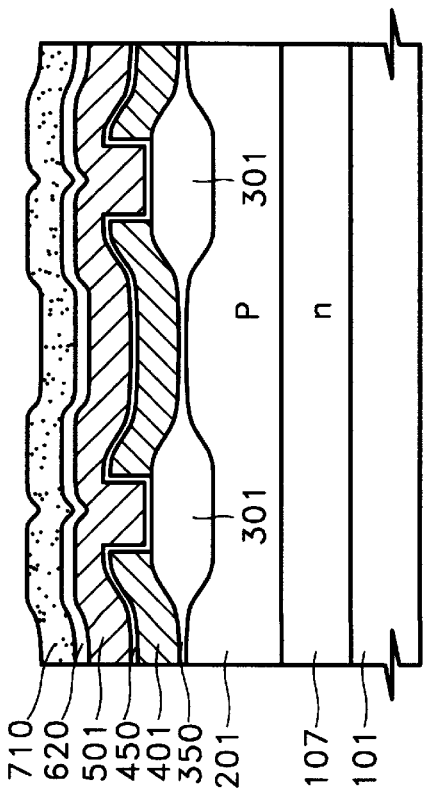

FIGS. 16A and 16B represent a third embodiment of this invention. FIG. 16A is a sectional view taken along line V–V' of FIG. 15, and FIG. 16B is a sectional view taken along line VI–VI'. The reference characters used in FIGS. 16A and 16B which are the same as those used in FIGS. 8A and 8B indicate the same structures as those in FIGS. 8A and 8B. Reference numeral 101 indicates a P-type semiconductor substrate, reference numeral 107 indicates a N-well, reference numeral 201 indicates a P-well, reference numeral 301 indicates a field oxide film for dividing a semiconductor substrate into active regions and nonactive regions, reference numeral 350 indicates a gate oxide film, reference numeral 370 indicates a source/drain region, reference numeral 401 indicates a floating gate, reference numeral 450 indicates an interdielectric layer, reference numeral 501 indicates a control gate, reference numeral 600 indicates a first insulating film, and reference numeral 710 indicates a program assisting plate PA-plate.

Figure 17A:
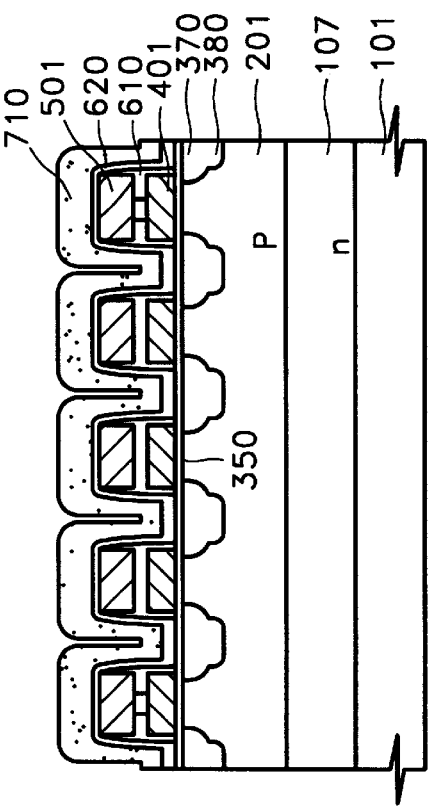
FIGS. 17A and 17B are sectional views, respectively taken along lines V–V' and VI–VI' of FIG. 15, showing the nonvolatile memory device according to the fourth embodiment of the present invention.
Figure 17B:
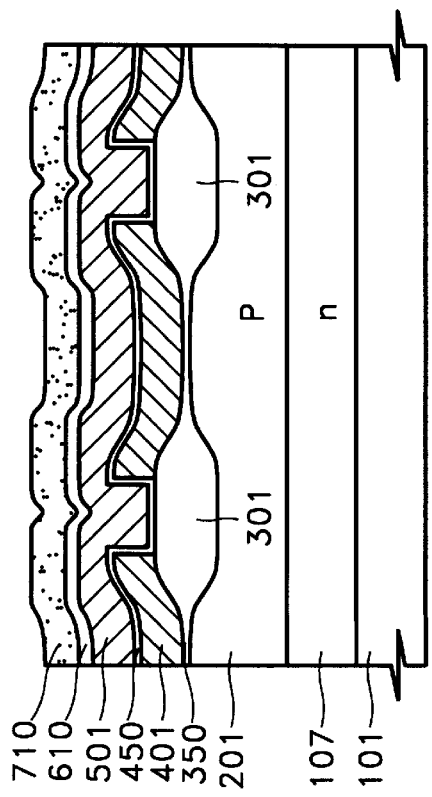

In FIG. 16B, the program assisting plate 710 is shown as formed over the cell transistors, string select transistors, and source select transistors. As previously stated, the PA-plates may alternatively be formed over only the cell transistors and string select transistors, only the cell transistors and source select transistors, or over the cell transistors and partially covering either or both of the string select and source select transistors. FIGS. 17A and 17B represent a fourth embodiment of this invention. FIG. 17A is a sectional view taken along line V–V' of FIG. 15, and FIG. 17B is a sectional view taken along line VI–VI'. The reference characters used in FIGS. 17A and 17B which are the same as those used in FIGS. 9A and 9B indicate the same structures as in FIGS. 9A and 9B. Here, as in FIGS. 16A and 16B, the program assisting plate 710 is formed on the cell transistors, string select transistors, and source select transistors, spaced from those structures by a first insulating film 620 and sidewall insulating film 610. Again, the PA-plate may extend as described above with reference to FIGS. 16A and 16B. A lightly doped drain (LDD) structure is used for source/drain regions 380 and 390 of the string select transistors, cell transistors, and source select transistors, wherein a sidewall insulating film 610 having a spacer shape is formed on the sidewalls of the floating gate 401 and the control gate 501.

In a nonvolatile memory device according to the third and fourth embodiments of the present invention, the coupling ratio of the memory cells is increased, to thereby reduce the program and erase voltages, increase the speed of operation, and reduce power consumption. In addition, the conductive residue resulting from the step difference in the region between the select transistor and the adjacent cell transistor can be eliminated, thereby enhancing the electrical characteristics of the device as compared with the first and second embodiments.

Device Operation

Referring to the plan views in FIGS. 6 and 15 and the equivalent circuit diagram of FIG. 7, the operation of a nonvolatile memory device according to the present invention is described below. The examples below describe the operation of a device having a supply voltage Vcc of approximately 3.3 volts. Of course, this invention is equally applicable to nonvolatile memory devices which operate at a Vcc of 5 V, 2.7 V, or some other supply voltage. In devices which operate at supply voltages other than 3.3 V, some of the various program, read, and erase voltages would be changed accordingly.

1) Programming Operation

In a method of operating a nonvolatile memory device according to the first through fourth embodiments of the present invention, during program operation, a bias voltage having the same voltage as that of the selected wordline is applied to the program assisting plate PA-plate.

In a programming operation, 0 V is applied to a selected bitline B/L and Vcc is applied to an unselected bitline. A predetermined program voltage Vpgm of approximately 12V~16V is applied to a selected wordline W/L and to a selected PA-plate, in order to generate F-N tunneling from a channel of the cell transistor to a floating gate thereof. Also, Vcc is applied to the unselected wordline and the string select line SSL1, in order to transmit the voltage which is applied to the selected or unselected bitline to the channel of the cell transistor. Vcc or 0 V is applied to the source line S/L, and 0 V is applied to the source select line SSL2, the substrate 101, an N-type well 107, and a P-type well 201, shown in FIGS. 8–9 and 16–17. In this case, Vcc is approximately 3.3 volts.

For example, in FIG. 7, in the case of storing information in a first cell transistor C1 of a first string 60, 0 V is applied to a bitline B/L1 of the selected first string 60, and then Vcc is applied to the string select line SSL1, to thereby turn on the string select transistor S1. 0 V is applied to the source select line SSL2, to thereby turn off the source select transistor S2.

Then, through the selected first wordline W/L1, the program voltage Vpgm of approximately 12~16 V is applied to the control gate of the first cell transistor C1, and the same program voltage Vpgm as that of the selected first wordline W/L1 is applied to the selected first PA-plate PA, to thereby generate F-N tunneling in order to move electrons from the channel region of the first cell transistor C1 to the floating gate thereof.

Meanwhile, Vcc is applied to unselected wordlines W/L2, ..., W/Ln in order to transmit the voltage, which is applied to the selected or unselected bitline, to a channel of the unselected cell transistors C2, ..., Cn. 0 V is applied to the semiconductor substrate 101, the N-type well 107, and the P-type well 201 shown in FIGS. 8–9 and 16–17.

2) Erasing Operation

In an erasing operation, 0 V is applied to a selected wordline W/L and PA-plate, and an unselected wordline, string select line SSL1, and source select line SSL2 are "floated." In order to generate F-N tunneling from the floating gate to a P-type well, an erase voltage Verase of approximately 14~16V is applied to the N-type well 107, the P-type well 201, and the semiconductor substrate 101 shown in FIGS. 8–9 and 16–17.

For example, in FIG. 7, in order to erase information stored in the first cell transistor C1 of the first string 60, 0 V is applied to the first wordline W/L1 and the PA-plate associated with the selected first cell transistor C1, and unselected wordlines W/L2, . . . , W/Ln, string select line SSL1 and source select line SSL2 are floated and an erase voltage Verase of approximately 14~18 V is applied to the semiconductor substrate 101, the N-type well 107, and the P-type well 201 shown in FIGS. 8–9 and 16–17. Accordingly, F-N tunneling from the floating gate of the first cell transistor C1 to the channel region thereof occurs, thereby erasing the information stored in cell transistor C1.

3) Reading Operation

In the reading operation, 0 V is applied to a selected wordline W/L and an unselected string select line, and a read voltage Vread higher than Vcc is applied to an unselected wordline and a selected string select line. 0 V or Vread higher than Vcc is applied to the selected PA-plate. Also, a voltage higher than 0 V is applied to the selected bitline and 0 V is applied to the source line S/L, to thereby read the state of the selected cell transistor as "ON" or "OFF". In this example, Vcc is 3.3 V and Vread is 4.5 V, although other values may be used.

For example, in order to read information stored in the first cell transistor C1 of the first string 60, Vcc is applied to a string select line SSL1 and a source select life SSL2, to thereby turn on a string select transistor S2, and 0 V is applied to a source line S/L. A voltage of 0 V or Vread higher than Vcc is applied to the selected PA-plate associated with the cell which is being read.

Then, 0 V is applied to a selected first wordline W/L1 and Vcc is applied to unselected wordlines W/L2, . . . , W/Ln. Also, a predetermined read voltage Vread is applied to a selected first bitline B/L1. Accordingly, when the first cell transistor C1 is turned on and thus current of the first bitline B/L1 to the source line S/L is sensed, the first cell transistor C1 is read as "1". When the first cell transistor C1 is turned off and thus current is not sensed, the first cell transistor C1 is read as "0".

Typical Electrical Characteristics of the Invention

Figure 18A:
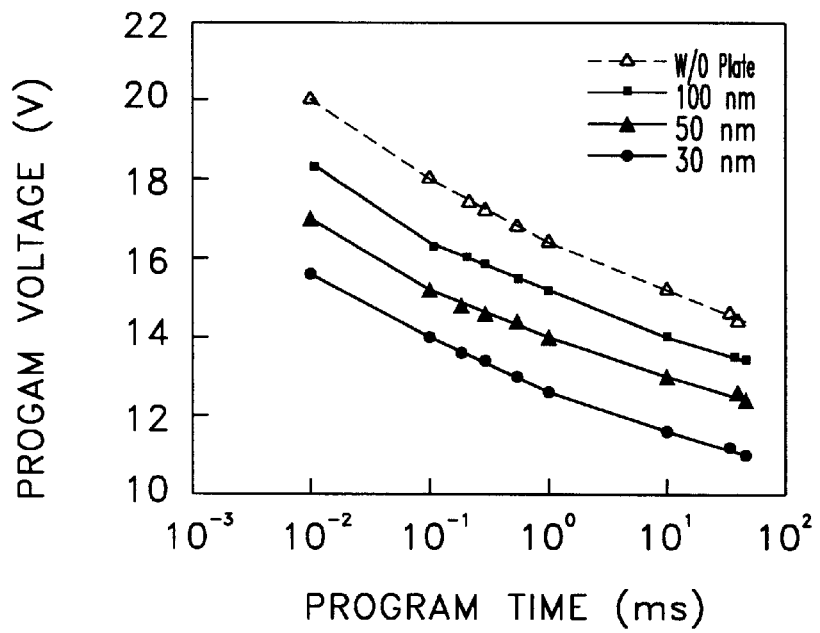
FIGS. 18A through 18C are graphs showing operation voltage and the cell current of a nonvolatile memory device according to the present invention.

FIG. 18A shows the program voltage required for obtaining a threshold voltage of 1V according to the program time and the thickness of the insulating film under the PA-plate. When the thickness of the first insulating film is 30 nm, the program cell coupling ratio γpgm is 0.78. Accordingly, the programming speed in this case is higher than those of the other three cases: without a PA-plate, 100 nm insulating film or 50 nm insulating film.

The cell coupling ratio Tpg may be calculated as:

$$\gamma pgm = Vfg/Vcg = (Cfc + 2CEa)/(Cfc + Cfs + 2Cfp);$$

where:

Vfg=floating gate voltage

Vcg=control gate voltage

Cfc=capacitance between floating gate and control gate

Cfp=capacitance between each side of floating gate and PA-plate

Cfs=capacitance between floating gate and substrate

Figure 18B:
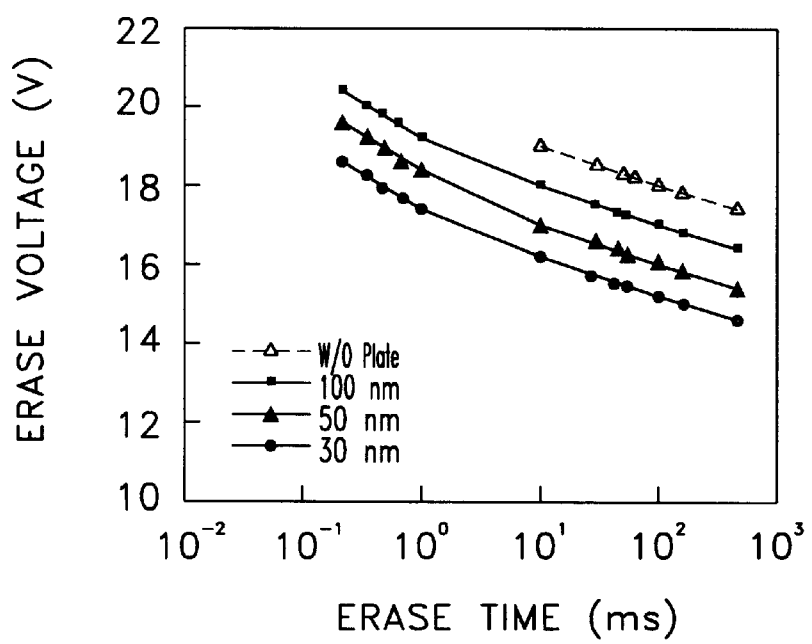

FIG. 18B shows the erase voltage required for obtaining a threshold voltage of −3V according to the program time and the thickness of the insulating film under the PA-plate. Since the erase cell coupling ratio during the erase operation is 1−γpgm, the PA-plate increases the voltage difference between the semiconductor substrate and the floating gate.

Accordingly, it can be seen that when the insulating film is 30 nm, the erase speed increases by more than 150 times, compared with a conventional device.

Figures 18C, 19:
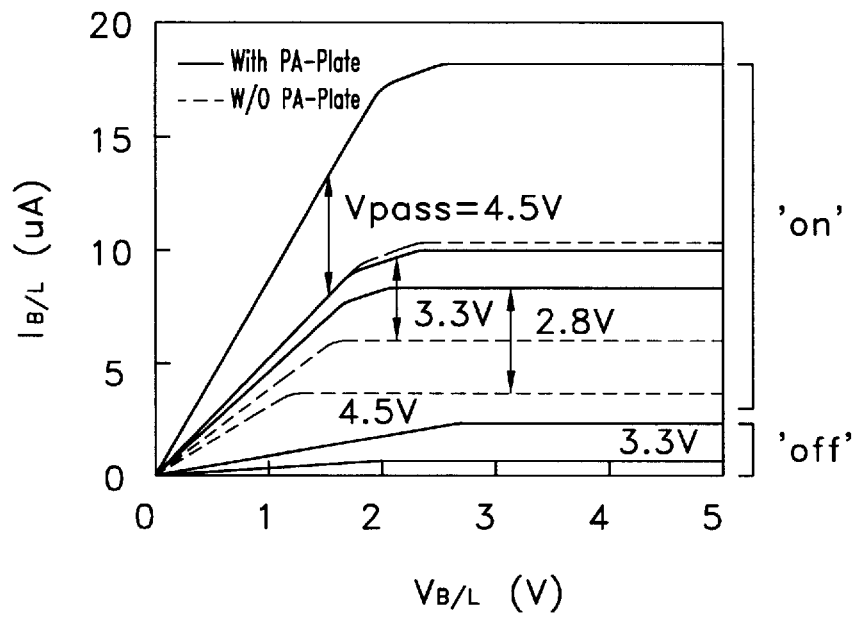
FIG. 19 is a table showing a comparison between the operational characteristics of a nonvolatile memory device according to the present invention and the characteristics of a conventional nonvolatile memory device.

FIG. 18C shows the cell current $I_{B/L}$ on the bitline in a reading operation at different levels of the pass voltage Vpass applied to the unselected wordlines for both conventional devices without a PA-plate and for devices with a PA-plate. In the graph, Vcc is applied to the PA-plate during the reading operation. It can be seen that the cell current is increased in a device with the PA-plate. The increased cell current occurs because a higher bias voltage is applied to the floating gate due to the high capacitive coupling ratio resulting from the PA-plate. According to the present invention with the PA-plate, the "on" cell current is higher by approximately 70% than the cell current in a conventional cell without a PA-plate at the same level of Vpass, when using conventional read voltages. Accordingly, Vcc can be used as the pass voltage Vpass in both the programming operation and the reading operation. Vpass is typically about 10V for programming and about 4.5V for a read operation in conventional circuitry.

In FIG. 19, the characteristics of a cell with a PA-plate are compared with a conventional cell without a PA-plate. In the cell with a PA-plate, the program voltage Vpgm is lowered to 13 V from 17 V, the erase voltage Verase is lowered to 16 V from 19 V, the pass voltage Vpass during programming is lowered to Vcc from 10 V, and the pass voltage Vpass during the reading operation is lowered to Vcc (3.3 V) from 4.5 V.

Accordingly, this invention increases the cell coupling ratio of the device, thereby greatly reducing the program/erase voltage.

Second, this invention results in a flat cell structure, which both leads to a simplified manufacturing process and facilitates subsequent manufacturing processes.

Third, the PA-plate has a relatively large line spacing, which facilitates the photolithography process.

Also, in the cases in which the PA-plate is formed over the select transistors, the step difference between the select transistor and the wordline is reduced, thereby facilitating subsequent processes, and reducing or eliminating conductive residue, thereby enhancing the electrical characteristics of the device.

This invention may be used in nonvolatile memory devices in which one bit or more than one bit is stored in each memory cell, and it may be used in NAND, AND, NOR, and DINOR nonvolatile memory arrays, all of which are well-known to nonvolatile memory designers.

It should be understood that the invention is not limited to the illustrated embodiments and that many changes and modifications may be made to the embodiments without departing from the spirit and scope of the following claims.

What is claimed is:

1. A method of manufacturing a nonvolatile memory device, comprising:

(a) sequentially forming second and first conductivity type wells in a semiconductor substrate of a first conductivity type;

(b) forming an isolation layer and a gate insulating layer on the semiconductor substrate;

(c) forming a plurality of gate structures including impurity ions of second conductivity type on the gate insulating layer;

(d) forming sidewall insulators on the sides of the gate structures;

(e) forming source/drain regions between the gate structure the first conductivity type wells;

(f) forming an insulating layer over the plurality of gate strictures and over the semiconductor substrate; and (g) forming a continuous conductive program-assist plate over the insulating layer and over the plurality of gate structures.

2. A method of manufacturing a nonvolatile memory device as in claim 1, wherein step (d) further comprises:

implanting impurities of the second conductivity type into the first conductivity type wells in a dose of approximately $2\times10^{13}$~$1\times10^{15}$ ion/cm$^2$ and at an energy of approximately 40 KeV~60 KeV.

3. A method of manufacturing a nonvolatile memory device as in claim 1, wherein the program-assist plate comprises one selected from the group consisting of polysilicon and polycide.

4. A method of manufacturing a nonvolatile memory device as in claim 1, wherein the insulating layer comprises one selected from the group consisting of an oxide layer, a nitride layer, an oxynitride layer, and a composite layer thereof.

5. A method of manufacturing a nonvolatile memory device as in claim 2, wherein:

the program-assist plate comprises one selected from the group consisting of polysilicon and polycide; and the insulating layer comprises one selected from the group consisting of an oxide layer, a nitride layer, an oxynitride layer, and a composite layer thereof.

6. A method of manufacturing a nonvolatile memory device as in claim 5, wherein the gate structures are formed in a NAND array.

7. A method of manufacturing a nonvolatile memory device as in claim 5, wherein the gate structures are formed in an AND array.

8. A method of manufacturing a nonvolatile memory device as in claim 1, wherein the step of forming the plurality of gate structures further comprises:

forming a floating gate layer on the gate insulating layer;

forming an interdielectric layer on the floating gate layer;

selectively etching contact holes through the interdielectric layer to selectively expose portions of the floating gate layer for forming select transistors in some of the gate structures;

forming a control gate layer on the interdielectric layer, and for the select transistors, through the contact holes and on the floating gate layer; and selectively patterning the control gate layer, the interdielectric layer, and the floating gate layer to form the plurality of gate structures.

9. A method of manufacturing a nonvolatile memory device, comprising:

(a) sequentially forming second and first conductivity type wells in a semiconductor substrate of a first conductivity type;

(b) forming an isolation layer and a gate insulating layer on the semiconductor substrate;

(c) forming a plurality of gate structures on the gate insulating layer, wherein the gate structures have sidewalls;

(d) implanting impurity ions of low concentration between the gate structures into the first conductivity type wells, thereby forming source/drain regions of low concentration;

(e) forming a sidewall insulating layer on the sidewalls of the gate structures;

(f) implanting impurity ions of high concentration between the adjacent sidewall insulating layers into the first conductivity type wells, thereby forming source/drain regions of high concentration;

(g) forming an insulating layer over the plurality of gate structures, on the sidewall insulating layer, and over the semiconductor substrate; and (h) forming a continuous conductive program-assist plate over the insulating layer and over the plurality of gate structures.

10. A method of manufacturing a nonvolatile memory device as in claim 9, wherein:

step (d) further comprises implanting impurities of the second conductivity type into the first conductivity type wells at a dose of approximately $2\times10^{13}$~$1\times10^{14}$ ion/cm$^2$ and at an energy of approximately 40 KeV~60 KeV; and step (f) further comprises implanting impurities of the second conductivity type into the first conductivity type wells at a dose of approximately $1\times10^{14}$~$5\times10^{15}$ ion/cm$^2$ and at an energy of approximately 40 KeV~60 KeV.

11. A method of manufacturing a nonvolatile memory device as in claim 9, wherein the program-assist plate comprises one selected from the group consisting of polysilicon and polycide.

12. A method of manufacturing a nonvolatile memory device as in claim 9, wherein the insulating layer comprises one selected from the group consisting of an oxide layer, a nitride layer, an oxynitride layer, and a composite layer thereof.

13. A method of manufacturing a nonvolatile memory device as in claim 9, wherein:

the program-assist plate comprises one selected from the group consisting of polysilicon and polycide; and the sidewall insulating layer and the insulating layer each comprise one selected from the group consisting of an oxide layer, a nitride layer, an oxynitride layer, and a composite layer thereof.

14. A method of manufacturing a nonvolatile memory device as in claim 13, wherein the gate structures are formed in a NAND array.

15. A method of manufacturing a nonvolatile memory device as in claim 13, wherein the gate structures are formed in an AND array.

16. A method of manufacturing a nonvolatile memory device as in claim 13, wherein the gate structures are formed in a NOR array.

17. A method of manufacturing a nonvolatile memory device as in claim 13, wherein the gate structures are formed in a DiNOR array.

18. A method of manufacturing a nonvolatile memory device as in claim 9, wherein the step of forming the plurality of gate structures further comprises:

forming a floating gate layer on the gate insulating layer;

forming an interdielectric layer on the floating gate layer;

selectively etching contact holes through the interdielectric layer to selectively expose portions of the floating gate layer for forming select transistors in some of the gate structures;

forming a control gate layer on the interdielectric layer, and for the select transistors, through the contact holes and on the floating gate layer; and selectively patterning the control gate layer, the interdielectric layer, and the floating gate layer to form the plurality of gate structures.

19. A method of manufacturing a nonvolatile memory device, comprising the steps of:

(a) sequentially forming second and first conductivity type wells in a semiconductor substrate of a first conductivity type;

(b) forming an isolation layer and a gate insulating layer on the semiconductor substrate;

(c) forming a plurality of gate structures on the gate insulating layer, wherein the gate structures have sidewalls;

(d) implanting impurity ions between the gate structures into the first conductivity type wells, thereby forming source/drain regions;

(e) forming an insulating layer over the plurality of gate structure and over the semiconductor substrates; and (f) forming a continuous conductive program-assist plate over the insulating layer and over the plurality of gate structures.

20. A method of manufacturing a nonvolatile memory device as in claim 9, wherein the program-assist plate comprises one selected from the group consisting of polysilicon and polycide.

21. A method of manufacturing a nonvolatile memory device as in claim 19, wherein the step of forming the plurality of gate structures further comprises:

forming a floating gate layer on the gate insulating layer;

forming an interdielectric layer on the floating gate layer;

selectively etching contact holes through the interdielectric layer to selectively expose portions of the floating gate layer for forming select transistors in some of the gate structures;

forming a control gate layer on the interdielectric layer, and for the select transistors, through the contact holes and on the floating gate layer; and selectively patterning the control gate layer, the interdielectric layer, and the floating gate layer to form the plurality of gate structures.

* * * * *

UNITED STATES PATENT AND TRADEMARK OFFICE
CERTIFICATE OF CORRECTION

PATENT NO. : 6,093,605   Page 1 of 1
DATED : July 25, 2000
INVENTOR(S) : Mang et al.

It is certified that error appears in the above-identified patent and that said Letters Patent is hereby corrected as shown below:

<u>Claim 20,</u>
Line 19, please delete "9" and substitute -- 19 -- therefor.

Signed and Sealed this

Fourteenth Day of August, 2001

Attest:

NICHOLAS P. GODICI
Attesting Officer    Acting Director of the United States Patent and Trademark Office